(12) United States Patent
Shimazawa et al.

(10) Patent No.: US 7,426,096 B2
(45) Date of Patent: Sep. 16, 2008

(54) MAGNETORESISTIVE EFFECTIVE ELEMENT WITH HIGH OUTPUT STABILITY AND REDUCED READ BLEEDING AT TRACK EDGES

(75) Inventors: Koji Shimazawa, Chuo-ku (JP); Kosuke Tanaka, Chuo-ku (JP)

(73) Assignee: TDK Corporation, Tokyo (JP)

( * ) Notice: Subject to any disclaimer, the term of this patent is extended or adjusted under 35 U.S.C. 154(b) by 511 days.

(21) Appl. No.: 10/828,292

(22) Filed: Apr. 21, 2004

(65) Prior Publication Data

US 2004/0212932 A1   Oct. 28, 2004

(30) Foreign Application Priority Data

Apr. 24, 2003   (JP)   ............... 2003-119251

(51) Int. Cl.
    *G11B 5/39*   (2006.01)
(52) U.S. Cl. ............... 360/319; 360/324.12; 360/324.2
(58) Field of Classification Search ............. 360/324.2, 360/319, 324.11, 324.12
    See application file for complete search history.

(56) References Cited

U.S. PATENT DOCUMENTS

| | | | |
|---|---|---|---|
| 5,898,548 A * | 4/1999 | Dill et al. ................. | 360/324.2 |
| 6,430,010 B1 * | 8/2002 | Murdock ................... | 360/319 |
| 6,466,419 B1 * | 10/2002 | Mao ........................... | 360/319 |
| 6,700,760 B1 * | 3/2004 | Mao ........................... | 360/324.2 |
| 6,943,993 B2 * | 9/2005 | Chang et al. ............. | 360/319 |
| 2002/0008016 A1 * | 1/2002 | Hayashi et al. ........... | 324/252 |
| 2002/0135947 A1 | 9/2002 | Aoki et al. | |
| 2002/0167768 A1 * | 11/2002 | Fontana et al. ........... | 360/324.2 |
| 2003/0002229 A1 * | 1/2003 | Pinarbasi .................. | 360/324.2 |
| 2003/0030944 A1 | 2/2003 | Lin et al. | |
| 2003/0035256 A1 * | 2/2003 | Hayashi et al. ........... | 360/324.2 |
| 2003/0143431 A1 * | 7/2003 | Hasegawa .................. | 428/692 |
| 2003/0206383 A1 * | 11/2003 | Meguro et al. ........... | 360/324.2 |
| 2004/0061986 A1 * | 4/2004 | Kagami et al. ........... | 360/324.11 |
| 2004/0100737 A1 * | 5/2004 | Nakamoto et al. ........ | 360/319 |

FOREIGN PATENT DOCUMENTS

| | | |
|---|---|---|
| JP | A 11-25431 | 1/1999 |
| JP | A-11-25431 | 1/1999 |
| JP | A 11-175928 | 7/1999 |
| JP | A-2002-123916 | 4/2002 |
| JP | A 2002-280643 | 9/2002 |

* cited by examiner

*Primary Examiner*—Craig A Renner
(74) *Attorney, Agent, or Firm*—Oliff & Berridge, PLC

(57) ABSTRACT

A first shielding layer and a second shielding layer are disposed by a given distance. An MR film is disposed in between the first shielding layer and the second shielding layer. The first gap film is formed on the MR film with commensurate to the surface configuration thereof. Magnetic domain controlling films are disposed at both sides of the MR film, respectively. Electrode layers are formed on the magnetic domain controlling layers, respectively. One of the second gap layers is located between the MR film; the magnetic domain controlling layers and the first shielding layer, and the other is located between the first gap layer; the electrode layer and the second shielding layer.

4 Claims, 16 Drawing Sheets

FIG. 2

Table 1                    Unit : nm

| | G1 | Gsv | Hd | Ld | G1 | G22 | GS | GL | GS-GL | MRWu | comment |
|---|---|---|---|---|---|---|---|---|---|---|---|
| S11 | 25 | 32.8 | 25 | 30 | 0 | 25 | 82.8 | 105 | −22.2 | 164 | |
| S12 | 25 | 32.8 | 25 | 25 | 0 | 25 | 82.8 | 100 | −17.2 | 163 | |
| S13 | 25 | 32.8 | 25 | 20 | 0 | 25 | 82.8 | 95 | −12.2 | 163 | |
| S14 | 25 | 32.8 | 25 | 15 | 0 | 25 | 82.8 | 90 | −7.2 | 161 | |
| S15 | 25 | 32.8 | 25 | 10 | 0 | 25 | 82.8 | 85 | −2.2 | 159 | |
| S16 | 25 | 32.8 | 25 | 5 | 0 | 25 | 82.8 | 80 | 2.8 | 156 | R>100Ω |
| S17 | 25 | 32.8 | 20 | 30 | 0 | 25 | 82.8 | 100 | −17.2 | 163 | |
| S18 | 25 | 32.8 | 15 | 30 | 0 | 25 | 82.8 | 95 | −12.2 | 162 | BHN |
| S19 | 25 | 32.8 | 10 | 30 | 0 | 25 | 82.8 | 90 | −2.2 | 162 | BHN |

FIG. 3

Table 2                    Unit : nm

| | G1 | Gsv | Hd | Ld | G1 | G22 | GS | GL | GS-GL | MRWu | comment |
|---|---|---|---|---|---|---|---|---|---|---|---|
| S21 | 25 | 32.8 | 25 | 30 | 13 | 12 | 82.8 | 92 | −9.2 | 161 | |
| S22 | 25 | 32.8 | 25 | 25 | 13 | 12 | 82.8 | 87 | −4.2 | 159 | |
| S23 | 25 | 32.8 | 25 | 20 | 13 | 12 | 82.8 | 82 | 82 | 157 | |
| S24 | 25 | 32.8 | 25 | 15 | 13 | 12 | 82.8 | 77 | 5.8 | 153 | |
| S25 | 25 | 32.8 | 25 | 10 | 13 | 12 | 82.8 | 72 | 10.8 | 148 | |
| S26 | 25 | 32.8 | 25 | 5 | 13 | 12 | 82.8 | 67 | 15.8 | 142 | R>100Ω |
| S27 | 25 | 32.8 | 20 | 30 | 13 | 12 | 82.8 | 87 | −4.2 | 160 | |
| S28 | 25 | 32.8 | 15 | 30 | 13 | 12 | 82.8 | 82 | 0.8 | 157 | BHN |
| S29 | 25 | 32.8 | 10 | 30 | 13 | 12 | 82.8 | 77 | 5.8 | 153 | BHN |

FIG. 4

Table 3                    Unit : nm

| | G1 | Gsv | Hd | Ld | G1 | G22 | GS | GL | GS-GL | MRWu | comment |
|---|---|---|---|---|---|---|---|---|---|---|---|
| S31 | 2 | 32.8 | 25 | 10 | 13 | 12 | 82.8 | 72 | 10.8 | 148 | |
| S32 | 25 | 32.8 | 25 | 10 | 15 | 10 | 82.8 | 70 | 12.8 | 146 | |
| S33 | 25 | 32.8 | 25 | 10 | 17 | 8 | 82.8 | 68 | 14.8 | 144 | |
| S34 | 25 | 32.8 | 25 | 10 | 19 | 6 | 82.8 | 66 | 16.8 | 141 | |
| S35 | 25 | 32.8 | 25 | 10 | 21 | 4 | 82.8 | 64 | 18.8 | 137 | IR |

MAGNETORESISTIVE EFFECTIVE ELEMENT WITH HIGH OUTPUT STABILITY AND REDUCED READ BLEEDING AT TRACK EDGES

BACKGROUND OF THE INVENTION

1. Field of the Invention

This invention relates to a magnetoresistive effective element, a thin film magnetic head, a magnetic head device and a magnetic recording/reproducing device.

2. Related Art Statement

A magnetoresistive effective element (hereinafter, called as an "MR element") has been employed in a magnetic storage element, a magnetic sensor or a thin film magnetic head. As of now, the MR element is made mainly of a giant magnetoresistive effective film such as a spin valve film (hereinafter, called as an "SV film") or a ferromagnetic tunnel junction film (hereinafter, called as a "TMR film"). Among the exemplified MR elements made of the giant magneto-resistive effective films, an attention is paid to the MR element made of the TMR element film as a component of an M-RAM (magnetic random access memory).

In contrast, a composite type thin film magnetic head, where a reproducing head and a recording head with an inductive type electromagnetic conversion element are stacked, has been widely available as the thin film magnetic head. With the thin film magnetic head, the GMR element is utilized as the reproducing head, and vast researches and developments are made to the reproducing head with the recently rapid development in high density recording of a hard disk (HDD).

It is required for the reproducing head to reduce the Barkhausen noise therein. In order to reduce the Barkhausen noise, for example, a biasing magnetic field is applied to the MR element in the long direction thereof by means of a permanent magnet or a biasing magnetic field applying layer (magnetic domain controlling layer) made of a ferromagnetic layer and an antiferromagnetic layer which is provided at both sides of the MR element.

With the biasing magnetic field applying layer, the biasing magnetic field applying layer and the electrode layer are thicker than the SV portion of the MR element, so that in the thin film magnetic head with the MR element, the top shielding film is deformed convexly toward the MR element. In this case, the recorded magnetic field from a recording medium is absorbed by the sides of the MR element, so that the recorded magnetic field is transmitted to the high sensitivity region at the center track of the recording medium to widen the effective track width thereof. In this point of view, it is proposed in Patent publication No. 1 to form a soft magnetic film partially on the electrode layer to reduce the reading bleeding of the track edge of the recording medium.

With the above-mentioned structure proposed in patent publication No. 1, however, the magnetic domain structure of the edges of the soft magnetic layer becomes complicated, so that the magnetic field from the edges of the soft magnetic layer affects on the MR element to generate a side lobe defect therein.

In contrast, it is proposed in Patent publication No. 2 to set the gap distance (G1s) of the electrode portion relatively larger than the gap distance (G1c) of the SV portion to reduce the effective track width.

In order to reduce the effective track width sufficiently, however, it is found, it is required to satisfy the relation of G1s<G1c. In this case, the biasing magnetic field applying layer and the electrode layer are required to be formed much thinner, so that the output of the MR element is fluctuated due to the Barkhausen noise, which is originated from the thinner biasing magnetic field applying layer and the head noise is increased due to the increase in resistance of the thin film magnetic head, which is originated from the thinner electrode layer.

Patent Publication No. 1:
Japanese Patent Application Laid-open No. 11-175928
Patent Publication No. 2:
Japanese Patent Application Laid-open No. 2002-280643
Patent Publication No. 3:
Japanese Patent Application Laid-open No. 11-25431

SUMMARY OF THE INVENTION

It is an object of the present invention to provide an MR element, a thin film magnetic head, a magnetic head device and a magnetic recording/reproducing device which can reduce a reading bleeding at a track edge and realize a high output stability.

For achieving the above object, this invention relates to two types of MR elements.

1. First Embodiment of MR Element

The first embodiment relates to a so-called CIP type MR element where a sense current is flowed laterally through the MR film. The MR element includes a first shielding layer, a second shielding layer, an MR film, a first gap layer, a pair of magnetic domain controlling layers, a pair of electrode layers and second gap layers.

The first shielding layer and the second shielding layer are disposed by a given distance. The MR film is disposed in between the first shielding layer and the second shielding layer. The first gap film is an insulating film, and formed on the MR film with commensurate to the surface configuration thereof.

The magnetic domain controlling films are disposed at both sides of the MR film, respectively. The electrode layers are formed on the magnetic domain controlling layers, respectively.

One of the second gap layers is located between the MR film; the magnetic domain controlling layers and the first shielding layer, and the other is located between the first gap layer; the electrode layer and the second shielding layer.

In this embodiment, since the magnetic domain controlling layers are disposed at both sides of the MR film, a biasing magnetic field is applied to the MR film in the long direction thereof from the magnetic domain controlling layers to reduce the Barkhausen noise therein. Since the electrode layers are formed on the magnetic domain controlling layers, respectively, a sense current can be flowed laterally through the MR film.

The first shielding layer and the second shielding layer are disposed by a given distance, and the MR film is disposed in between the first shielding layer and the second shielding layer. Therefore, the MR film conducts a given magnetic detection operation under the magnetic shield by the shielding layers.

In addition, one second gap layers is located between the MR film; the magnetic domain controlling layers and the first shielding layer, and the other second gap layer is located between the first gap layer; the electrode layers and the second shielding layer. Therefore, the sense current is not leaked by the second gap layers, and thus, can be flowed through a predetermined path.

This embodiment is characterized by the first gap layer, which is formed only on the MR film with commensurate to the surface configuration of the MR film. In this case, the total thickness of the MR film and the first gap layer can be set larger than the total thickness of the magnetic domain controlling layers and the electrode layers, so that both sides of the second shielding layer are depressed at both sides of the MR film in the front view, respectively. Therefore, the effective track width can be prevented from being magnetically widened. In comparison with Patent publication No. 1, since the magnetic field from the edges of the soft magnetic layer affects on the MR element, a side lobe defect can not be generated therein.

Accordingly, the reading bleeding at a track edge of the MR element can be reduced and the high output stability of the MR element can be realized. In this embodiment, the MR film is made of an SV film. Then, the first gap layer is generally made of metal oxide.

2. Second Embodiment of MR Element

The second embodiment relates to a so-called CPP type MR element where a sense current is flowed perpendicularly through the MR element. The MR element includes a first shielding layer, a second shielding layer, an MR film, a first gap layer, a pair of magnetic domain controlling layers, and a pair of electrode layers.

The first shielding layer and the second shielding layer are disposed by a given distance. The MR film is disposed in between the first shielding layer and the second shielding layer. The first gap layer is made of electrical conductive material, and formed on the MR film with commensurate to the surface configuration of the MR film.

The magnetic domain controlling films are disposed at both sides of the MR film. One of the electrode layers is electrically connected to the MR film in the far side from the first gap layer, constituting one second gap layer. The other is electrically connected to the first gap layer, constituting the other second gap layer.

In this embodiment, since the magnetic domain controlling layers are disposed at both sides of the MR film, respectively, a biasing magnetic field is applied to the MR film in the long direction thereof from the magnetic domain controlling layers to reduce the Barkhausen noise therein.

The first shielding layer and the second shielding layer are disposed by a given distance, and the MR film is disposed in between the first shielding layer and the second shielding layer. Therefore, the MR film conducts a given magnetic detection operation under the magnetic shield by the shielding layers.

One of the electrode layers is electrically connected to the MR film in the far side from the first gap layer. The other is electrically connected to the first gap layer made of electrical conductive material. Therefore, a sense current can be flowed perpendicularly through the MR film via the electrode layers, so that a CPP type MR element can be realized.

This embodiment is also characterized by the first gap layer, which is formed only on the MR film with commensurate to the surface configuration of the MR film. In this case, the total thickness of the MR film and the first gap layer can be set larger than the thickness of the magnetic domain controlling layers which are disposed at both sides of the MR film. Therefore, both sides of the second shielding layer are depressed at both sides of the MR film in the front view, respectively, so that the effective track width can be prevented from being magnetically widened. In comparison with Patent publication No. 1, since the magnetic field from the edges of the soft magnetic layer affects on the MR element, a side lobe defect can not be generated therein.

Accordingly, the reading bleeding at a track edge of the illustrated MR element can be reduced and the high output stability of the illustrated MR element can be realized. In this embodiment, the MR film is made of an SV film or a TMR film. Then, the first gap layer is made of electrical conductive material.

This invention also relates to a thin film magnetic head, a magnetic head device and a magnetic recording/reproducing device which are comprised of the above-mentioned magnetoresistive effective element.

Other objects, constitutions and advantages of the present invention will be described in detail hereinafter, with reference to the accompanying drawings. However, the drawings are only exemplified.

BRIEF DESCRIPTION OF THE DRAWINGS

For a better understanding of this invention, reference is made to the attached drawings, wherein:

FIG. 2 is a table listing experimental data when track narrowing is performed in a conventional MR element where the first gap layer is eliminated from the MR element illustrated in FIG. 1, FIG. 3 is a table listing experimental data when track narrowing is performed in the MR element illustrated in FIG. 1 by thinning the magnetic domain controlling layers or the electrode layers, FIG. 4 is a table listing experimental data when track narrowing is performed in the MR element illustrated in FIG. 1 by varying the ratio of the thickness of the first gap layer to the thickness of the upper second gap layer.

DETAILED DESCRIPTION OF PREFERRED EMBODIMENTS

1. First Embodiment of MR Element

Figure 1:
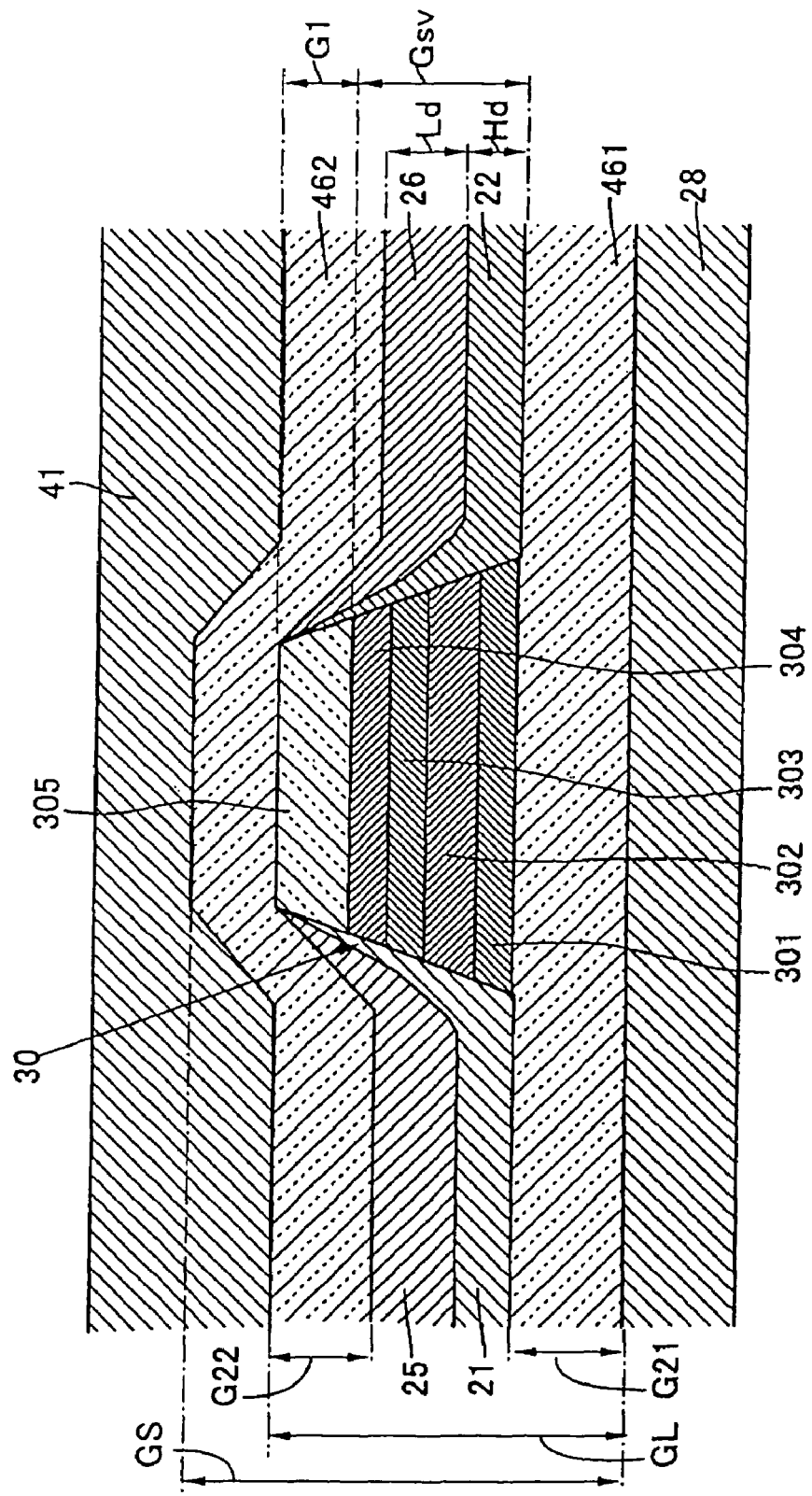
FIG. 1 is a cross sectional view illustrating an MR element according to the present invention.

FIG. 1 is a cross sectional view illustrating an MR element according to the present invention. The illustrated MR element can constitute a magnetic sensor, a magnetic storage element (M-RAM) or a reproducing head of a thin film magnetic head.

The illustrated MR element includes a first shielding layer 28, a second shielding layer 41, an MR film 30, a first gap layer 305, a pair of magnetic domain controlling layers 21; 22, a pair of electrode layers 25; 26 and second gap layers 461; 462.

The first shielding layer 28 and the second shielding layer 41 are disposed by a given distance. The first shielding layer 28 and the second shielding layer 41 are made of Sensust, permalloy and the like.

The MR film 30 is disposed in between the first shielding layer 28 and the second shielding layer 41. In this embodiment, the MR film 30 is constructed of a SV film with a thickness of Gsv which is composed of a free layer 301, a non-magnetic layer 302 adjacent to the free layer 301, a pinned layer 303 adjacent to the non-magnetic layer 302 and an antiferromagnetic layer 304 adjacent to the pinned layer 303. The magnetization direction of the pinned layer 303 is fixed through the exchange interaction with the antiferromagnetic layer 304.

The free layer 301 through the antiferromagnetic layer 304 can be made of materials commercially available at present, respectively. For example, the free layer 301 and the pinned layer 303 are made of NiFe, NiFeCo or CoFe, and the antiferromagnetic layer 304 is made of FeMn, MnIr, PtMn, NiMn or CrMnPt. The non-magnetic layer 302 is made of electrical conductive material mainly containing Cu, etc. The magnetic domain of the free layer 301 is controlled by a biasing magnetic field from the magnetic domain controlling layers 21 and 22.

The first gap film 305 is an insulating film with a thickness of G1, and is formed on the MR film 30 with commensurate to the surface configuration. In this embodiment, the MR film 30 and the first gap film 305 are flared downward, so that the cross sections of the MR film 30 and the first gap film 305 are narrowed upward and widened downward. As a result, the MR film 30 and the first gap film 305 are formed in trapezoid. The first gap film 305 can be made of metal oxide, and preferably AlOx, AlN, DLC, CN, SiO2, TaOx, FeOx, NiOx, CoOx or combination thereof.

The magnetic domain controlling films 21 and 22 are formed in a thickness of Hd and disposed at both sides of the MR film 30, respectively, to reduce the Barkhausen noise of the free layer 301 of the MR film 30. The magnetic domain controlling films 21 and 22 are made of a permanent magnet or a multilayered structure of ferromagnetic layers and antiferromagnetic layers. The electrode layers 25 and 26 are formed of Au in a thickness of Ld on the magnetic domain controlling layers 21 and 22, respectively.

The second gap layer 461 is located between the MR film 30; the magnetic domain controlling layers 21, 22 and the first shielding layer 28, and the second gap layer 462 is located between the first gap layer 305; the electrode layer 25, 26 and the second shielding layer 41. The second gap layers 461 and 462 are formed in respective thicknesses of G21 and G22 of oxide insulating material such as aluminum oxide or silicon oxide. The second gap layer 461 is formed on the flattened surface of the first shielding film 28. The MR film 30 and the magnetic domain controlling layers 21; 22 are also formed on the flattened surface of the second gap layer 461. The thickness G22 of the second gap layer 462 is preferably set to 4 nm or over.

In this embodiment, since the magnetic domain controlling layers 21 and 22 are disposed at both sides of the MR film 30, respectively, a biasing magnetic field is applied to the MR film 30 in the long direction thereof from the magnetic domain controlling layers 21 and 22 to reduce the Barkhausen noise therein. Since the electrode layers 25 and 26 are formed on the magnetic domain controlling layers 21 and 22, a sense current can be flowed laterally through the MR film 30.

The first shielding layer 28 and the second shielding layer 41 are disposed by a given distance, and the MR film 30 is disposed in between the first shielding layer 28 and the second shielding layer 41. Therefore, the MR film 30 conducts a given magnetic detection operation under the magnetic shield by the shielding layers 28 and 41.

In addition, the second gap layer 461 is located between the MR film 30; the magnetic domain controlling layers 21, 22 and the first shielding layer 28, and the second gap layer 462 is located between the first gap layer 305; the electrode layer 25, 26 and the second shielding layer 41. Therefore, the sense current is not leaked by the second gap layers 461 and 462, and thus, can be flowed in a predetermined path.

This embodiment is characterized by the first gap layer 305, which is formed only on the MR film 30 with commensurate to the surface configuration of the MR film 30 and has the thickness G1. In this case, the total thickness G1+Gsv of the MR film 30 and the first gap layer 305 can be set larger than the total thickness Hd+Ld of the magnetic domain controlling layers 21; 22 and the electrode layers 25; 26. Therefore, the center shielding gap length GS defined at the center position of the illustrated MR element where the MR film 30 and the first gap layer 305 are disposed can be set larger than the side shielding length GL defined at the side position of the illustrated MR element where the magnetic domain controlling layers 21; 22 and the electrode layers 25; 26 are disposed. In this case, both sides of the second shielding layer 41 are depressed at both sides of the MR film 30 in the front view, respectively, so that the effective track width can be prevented from being magnetically widened. In comparison with Patent publication No. 1, since the magnetic field from the edges of the soft magnetic layer affects on the MR element, a side lobe defect can not be generated therein.

Accordingly, the reading bleeding at a track edge of the illustrated MR element can be reduced and the high output stability of the illustrated MR element can be realized. Next, the function/effect of the illustrated MR element relating to the first embodiment will be described.

Experiment 1

In this experiment, track narrowing was performed in a conventional MR element where the first gap layer 305 was eliminated from the MR element illustrated in FIG. 1. The experimental data are listed in Table 1 of FIG. 2. In Table 1, the samples S11-S19 means the case where the magnetic domain controlling layers 21; 22 or the electrode layers 25; 26 are thinned. In this experiment, the MR film 30 was made of an SV film which was constructed of a multilayered structure of NiCr 20 Å/PtMn 150 Å/CoFe 15 Å/Ru 8 Å/Cu 20 Å/CoFe 10 Å/NiFe 30 Å/Ru 5 Å/Ta 20 Å. The thickness Gsv of the MR film 30 was set to 32.8 nm, and the second gap layers 461 and 462 were made of aluminum oxide ($Al_2O_3$).

In the samples S11-S16, the thickness Ld of the electrode layers 25 and 26 were thinned from 30 nm (sample S11) to 5 nm (sample S16). As apparent from Table 1, the difference between the center shielding gap GS and the side shielding gap GL is decreased as the thickness Ld of the electrode layers 25 and 26 are thinned. Particularly, in the sample S16 where the thickness Ld of the electrode layers 25 and 26 was set to 5 nm, the relation of GS>GL is satisfied and thus, the second shielding layer 41 is depressed downward. In the sample S16, the effective track width (MRWu) can be narrowed at the maximum. Since the resistance of the conventional MR element is beyond 100 W, however, the sample S16 can not be practically employed. In view of practical use, the track width of 159 nm in the sample S15 where the thickness Ld of the electrode layers 25 and 26 were set to 10 nm is the narrowest.

In the samples S17-S19, the thickness Hd of the magnetic domain controlling layers 21 and 22 made of CoCrPt (hard magnet) was thinned from 20 nm (sample S17) to 10 nm (sample S19). In the samples S18 and S19, since the thickness Hd of the magnetic domain controlling layers 21 and 22 are thinned 15 nm and 10 nm, respectively, Barkhausen noise BHN often occurs in the MR element. Therefore, in view of practical use, the track width of 163 nm in the sample S17 where the thickness Hd of the magnetic domain controlling layers 21 and 22 was set to 20 nm is the narrowest.

In this way, with the conventional MR element, even though the thickness Hd of the magnetic domain controlling layers 21; 22 and the thickness Ld of the electrode layers 25; 26 are controlled, the track narrowing can not be realized sufficiently because it is difficult to form the second shielding layer 41 depressed downward at both sides of the MR film 30.

Experiment 2

In this experiment, track narrowing was performed in the MR element illustrated in FIG. 1, where the magnetic domain controlling layers 21; 22 or the electrode layers 25; 25 were thinned. The experimental data are listed in Table 2 of FIG. 3. In this experiment, the SV film was formed in the same manner as Experiment 1. The first gap layer 305 was formed of tantalum oxide (TaOx).

In the samples S21-S26, the thickness Ld of the electrode layers 25 and 26 were thinned from 30 nm (sample S11) to 5 nm (sample S16). As apparent from Table 2, the difference between the center shielding gap GS and the side shielding gap GL is decreased as the thickness Ld of the electrode layers 25 and 26 are thinned. Particularly, in the samples S23-S26 where the thickness Ld of the electrode layers 25 and 26 were set within 20-5 nm, the relation of GS>GL is satisfied and thus, the second shielding layer 41 is depressed downward. In the sample S26 where the thickness Ld of the electrode layers 25 and 26 was set to 5 nm, the effective track width (MRWu) can be narrowed 142 nm, but can not be practically employed because the resistance of the MR element is beyond 100 W. In view of practical use, the track width of 148 nm in the sample S26 where the thickness Ld of the electrode layers 25 and 26 was set to 10 nm is the narrowest. In this way, the minimum effective track width (148 nm) of the MR element illustrated in FIG. 1 is narrower than the minimum effective track width (159 nm) of the conventional MR element by 11 mm. Therefore, it is turned out that the effective track width of the MR element illustrated in FIG. 1 is improved largely.

In the samples S27-S29, the thickness Hd of the magnetic domain controlling layers 21 and 22 made of CoCrPt (hard magnet) was thinned from 20 nm (sample S17) to 10 nm (sample S19). In the samples S28 and S29, since the thickness Hd of the magnetic domain controlling layers 21 and 22 are thinned 15 nm and 10 nm, respectively, Barkhausen noise BHN often occurs in the MR element. Therefore, in view of practical use, the track width of 148 nm in the sample S25 where the thickness Hd of the magnetic domain controlling layers 21 and 22 was set to 10 nm is the narrowest.

Experiment 3

In this experiment, track narrowing was performed in the MR element illustrated in FIG. 1 by controlling the ratio of the thickness G1 of the first gap layer 305 to the thickness G22 of the upper second gap layer 462 under the condition that the thickness Hd of the magnetic domain controlling layers 21; 22 and the thickness Ld of the electrode layers 25; 26 were set to the ones of sample S25 where the narrowest effective track width was realized in Experiment 2. The experimental results are listed in Table 3 of FIG. 4.

In this experiment, the SV film was formed in the same manner as Experiment 1. The second gap layer 462 was made of aluminum oxide ($Al_2O_3$), and the first gap layer 305 was formed of tantalum oxide (TaOx).

Referring to Table 3, the effective track width (MRWu) of the MR element is narrowed as the second gap layer 462 is thinned. The narrowest effective track width (MRWu) can be realized in the sample S35 where the thickness G22 of the second gap layer 462 was set to 4 nm, but since in the sample S 35, insulation failure often occurs between the electrode layers 25; 26 and the top shielding layer 41, the sample S 35 can not be practically employed. Therefore, in view of practical use, the track width of 141 nm in the sample S34 where the thickness G22 of the second gap layer 462 was set to 6 nm is the narrowest.

2. Second Embodiment of MR Element

Figure 5:
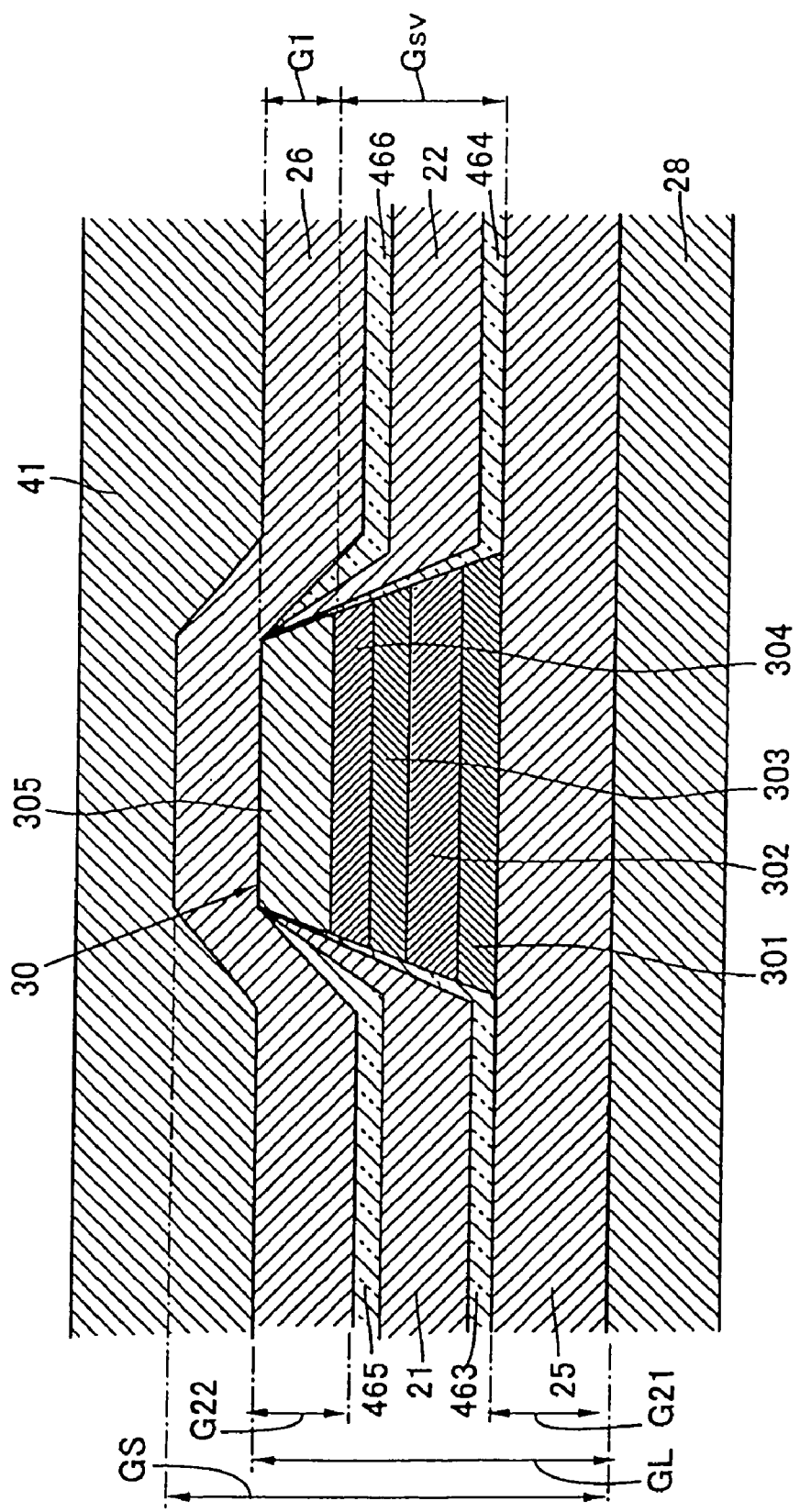
FIG. 5 is a cross sectional view illustrating another MR element according to the present invention.

FIG. 5 is a cross sectional view illustrating another MR element according to the present invention. In FIG. 5, like references are imparted to corresponding or like components of FIG. 1. In this embodiment, a CPP type MR element is exemplified where a sense current is flowed perpendicularly through the MR film 30.

The illustrated MR element includes a first shielding layer 28, a second shielding layer 41, an MR film 30, a first gap layer 305, a pair of magnetic domain controlling layers 21; 22, and a pair of electrode layers 25; 26.

The first shielding layer 28 and the second shielding layer 41 are disposed by a given distance. The MR film 30 is disposed in between the first shielding layer 28 and the second shielding layer 41.

The first gap layer 305 is made of electrical conductive material, and formed on the MR film 30 with commensurate to the surface configuration of the MR film 30.

The magnetic domain controlling films 21 and 22 are disposed at both sides of the MR film 30. The electrode layer 25 is electrically connected to the MR film 30 in the far side from the first gap layer 305, constituting one second gap layer. The electrode layer 26 is electrically connected to the first gap layer 305, constituting the other second gap layer. Insulating layers 463 and 464 are formed between the magnetic domain controlling layers 21; 22 and the electrode layer 25. Insulating layers 465 and 466 are formed between the magnetic domain controlling layers 21; 22 and the electrode layer 26. In this case, a sense current is not leaked by the insulating films 463-466, and thus, can be flowed through the path of the electrode layer 25—the magnetic domain controlling layers 21; 22—the electrode layer 26.

In this embodiment, since the magnetic domain controlling layers 21 and 22 are disposed at both sides of the MR film 30, a biasing magnetic field is applied to the MR film 30 in the long direction thereof from the magnetic domain controlling layers 21 and 22 to reduce the Barkhausen noise therein.

The first shielding layer 28 and the second shielding layer 41 are disposed by a given distance, and the MR film 30 is disposed in between the first shielding layer 28 and the second shielding layer 41. Therefore, the MR film 30 conducts a given magnetic detection operation under the magnetic shield by the shielding layers 28 and 41.

The electrode layer 25 is electrically connected to the MR film 30 in the far side from the first gap layer 305. The electrode layer 26 is electrically connected to the first gap layer 305 made of electrical conductive material, constituting the other second gap layer. Therefore, a sense current can be flowed perpendicularly through the MR film 30 via the electrode layers 25 and 26, so that a CPP type MR element can be realized.

As mentioned above, since the insulating layers 463-466 are disposed between the magnetic domain controlling layers 21; 22 and the electrode layer 25 and between the magnetic domain controlling layers 21; 22 and the electrode layer 26, the sense current is not leaked and thus, flowed through the predetermined path.

This embodiment is also characterized by the first gap layer 305, which is formed only on the MR film 30 with commensurate to the surface configuration of the MR film 30 and has the thickness G1. In this case, the total thickness G1+Gsv of the MR film 30 and the first gap layer 305 can be set larger than the thickness of the magnetic domain controlling layers 21 and 22. Therefore, both sides of the second shielding layer 41 are depressed at both sides of the MR film 30 in the front view, respectively, so that the effective track width can be prevented from being magnetically widened. In comparison with Patent publication No. 1, since the magnetic field from the edges of the soft magnetic layer affects on the MR element, a side lobe defect can not be generated therein.

Accordingly, the reading bleeding at a track edge of the illustrated MR element can be reduced and the high output stability of the illustrated MR element can be realized. In this embodiment, the MR film 30 is made of an SV film or a TMR film. Then, the first gap layer 305 is made of electrical conductive material.

Figure 6:
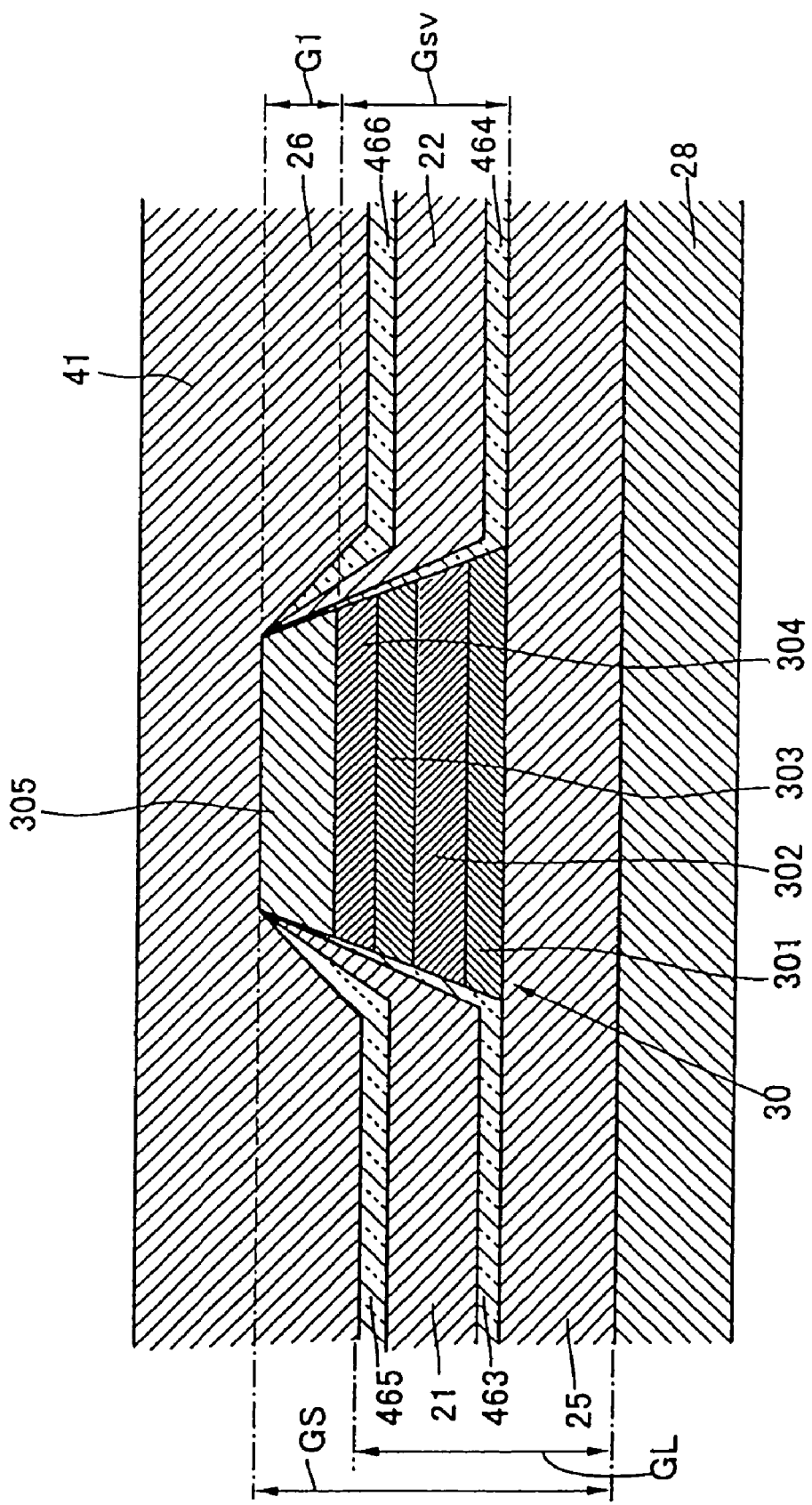
FIG. 6 is a cross sectional view illustrating still another MR element according to the present invention.

FIG. 6 is a cross sectional view illustrating still another embodiment of a MR element according to the present invention. The MR element illustrated in FIG. 6 is modified from the one illustrated in FIG. 5. In FIG. 6, like references are imparted to corresponding or like components of FIG. 5. This embodiment is characterized in that the second shielding layer 41 also functions as one electrode layer and one second gap layer. In this embodiment, since other components except the second shielding layer 41 are formed and disposed in the same manner as the ones illustrated in FIG. 5, further explanation will be omitted.

3. Fabricating Method of MR Element

Next, the fabricating method of an MR element according to the present invention will be described hereinafter, with reference to FIGS. 7-22. In these figures, FIGS. 7-14 relates to the fabricating method of the MR element illustrated in FIG. 1, and FIGS. 15-22 relates to the fabricating method of the MR element illustrated in FIG. 5. Not illustrated, the MR element illustrated in FIG. 6 can be fabricated in the same manner as shown in FIGS. 7-22 except some modifications.

Figure 7:
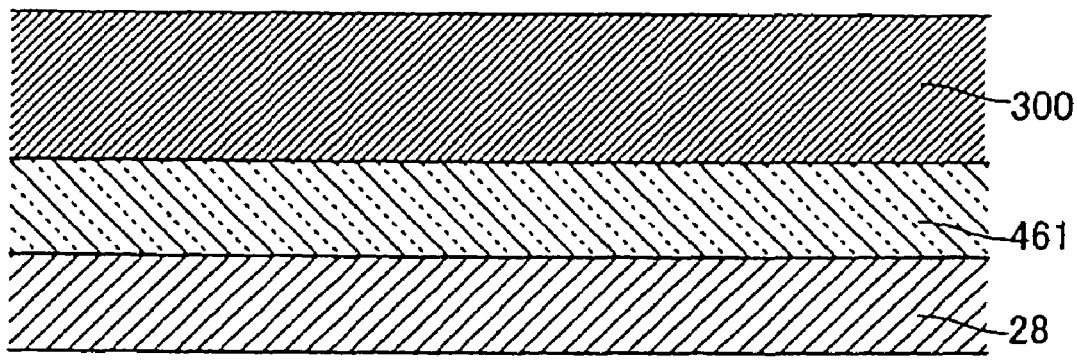
FIG. 7 is a cross sectional view illustrating one step in the fabricating method of the MR element illustrated in FIG. 1.
Figure 8:
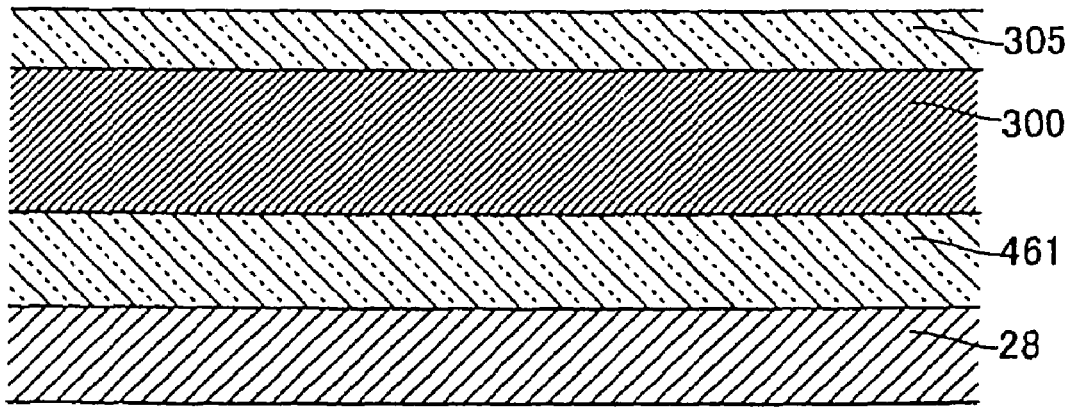
FIG. 8 is a cross sectional view illustrating the step after the step illustrated in FIG. 7.

First of all, as illustrated in FIG. 7, on the first shielding layer 28 are successively formed the insulating layer 461 and the MR layer 300. Then, as illustrated in FIG. 8, on the MR film 300 is formed the non-magnetic layer 305. These layers can be formed by means of sputtering. In the figures, the MR layer 300 is illustrated as a single layer, but if the MR layer 30 to be formed later is made of an SV film or a TMR film, the MR 300 is formed in a multilayered structure with commensurate to the SV film or the TMR film as illustrated in FIGS. 1, 5 and 6.

Figure 9:
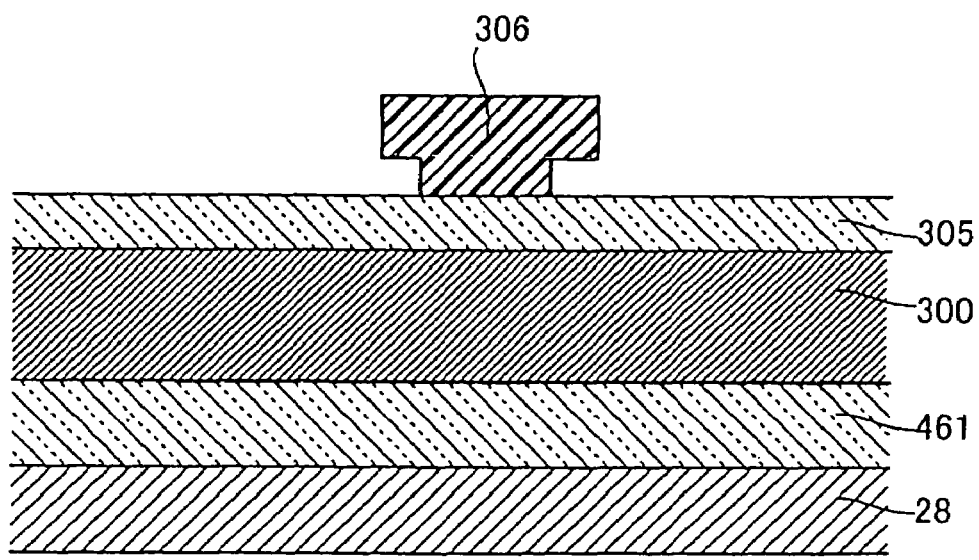
FIG. 9 is a cross sectional view illustrating the step after the step illustrated in FIG. 8.

Then, as illustrated in FIG. 9, on the non-magnetic layer 305 is formed an undercut resist mask 306 by means of conventional technique. With the undercut resist mask 306, the top resist layer is set larger than the bottom resist layer to realize a minute patterning.

Figure 10:
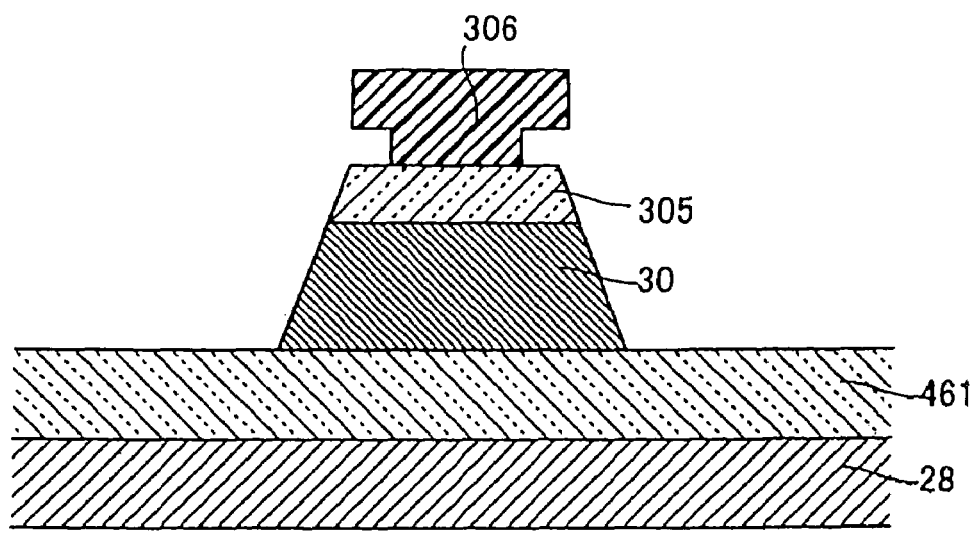
FIG. 10 is a cross sectional view illustrating the step after the step illustrated in FIG. 9.

Then, as illustrated in FIG. 10, the MR layer 300 is selectively etched by means of dry etching such as ion milling to form the MR film 30.

Figure 11:
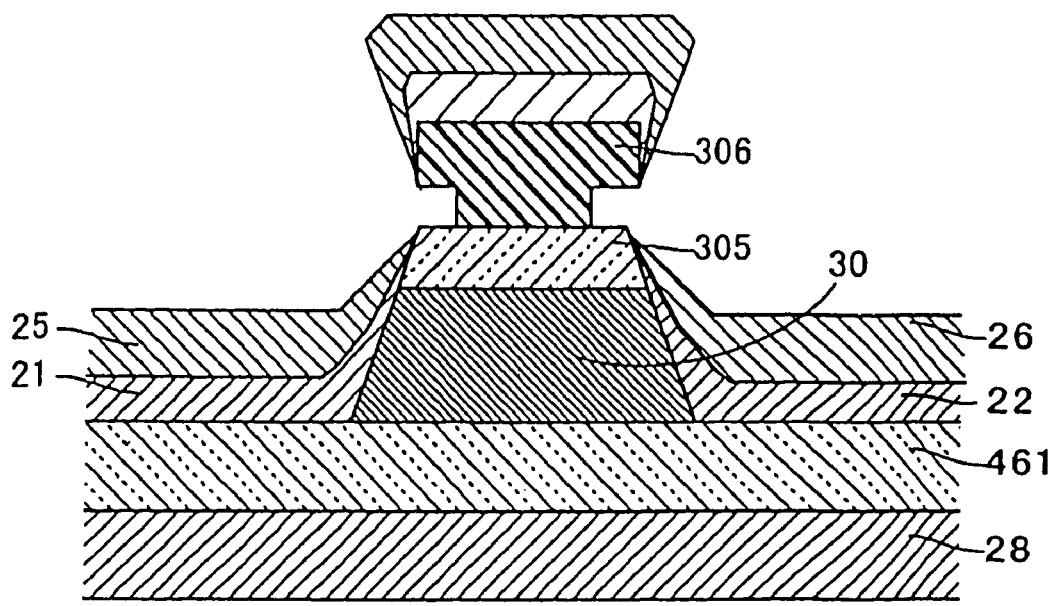
FIG. 11 is a cross sectional view illustrating the step after the step illustrated in FIG. 10.

Then, as illustrated in FIG. 11, a film forming technique such as sputtering is performed over the resist mask 306 to form the magnetic domain controlling layers 21; 22 and the electrode layers 25; 26.

Figure 12:
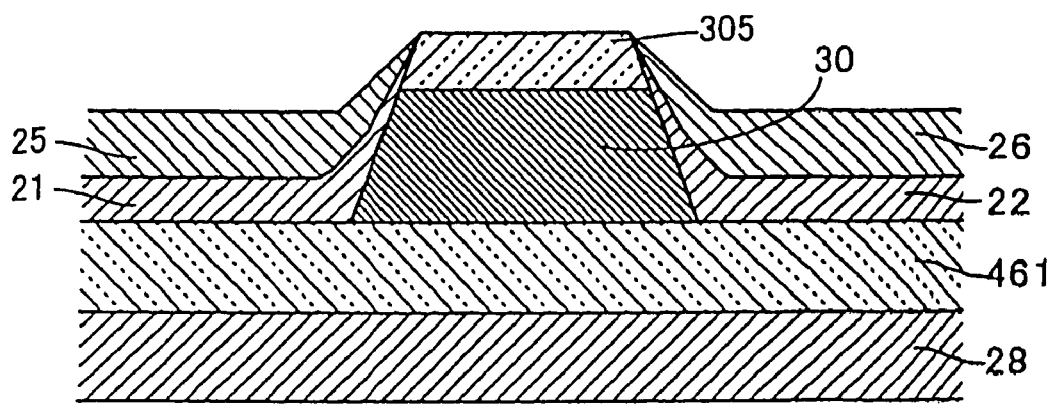
FIG. 12 is a cross sectional view illustrating the step after the step illustrated in FIG. 11.
Figure 13:
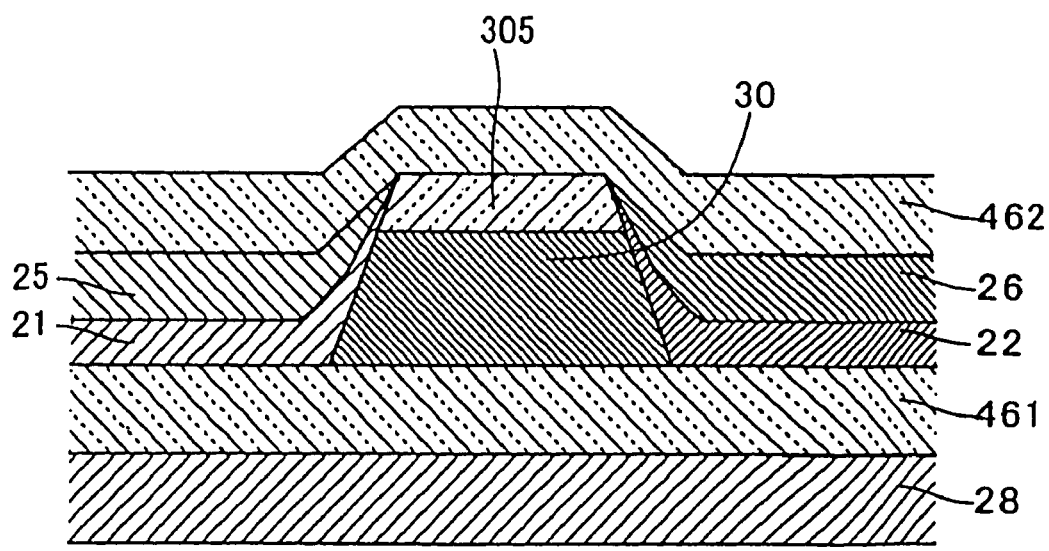
FIG. 13 is a cross sectional view illustrating the step after the step illustrated in FIG. 12.
Figure 14:
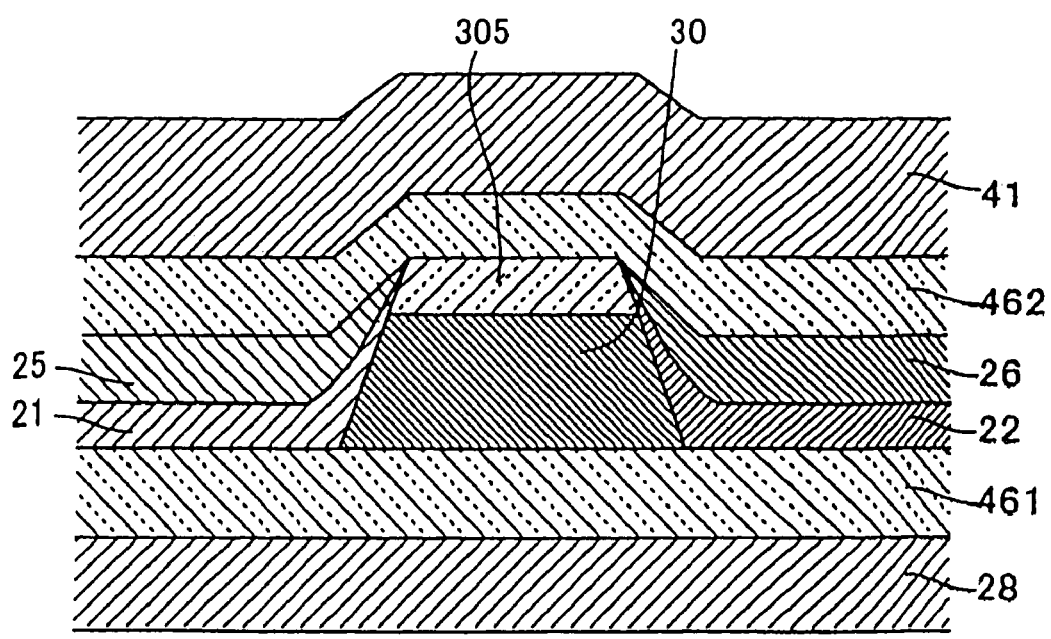
FIG. 14 is a cross sectional view illustrating the step after the step illustrated in FIG. 13.

Then, as illustrated in FIG. 12, the resist mask 306 is removed by means of lift off, and then, as illustrated in FIG. 13, a film forming technique such as sputtering is performed to form the second gap layer 462 of insulating material such as $Al_2O_3$. Then, as illustrated in FIG. 14, the second shielding layer 41 is formed.

Figure 15:
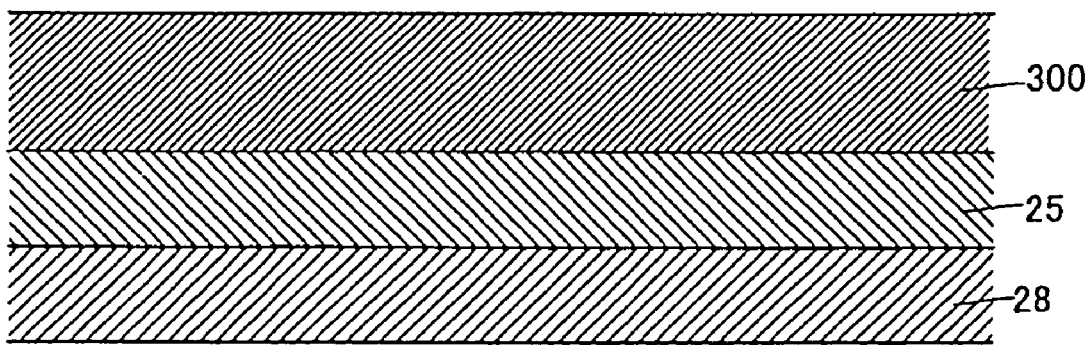
FIG. 15 is a cross sectional view illustrating the step after the step illustrated in FIG. 14.
Figure 16:
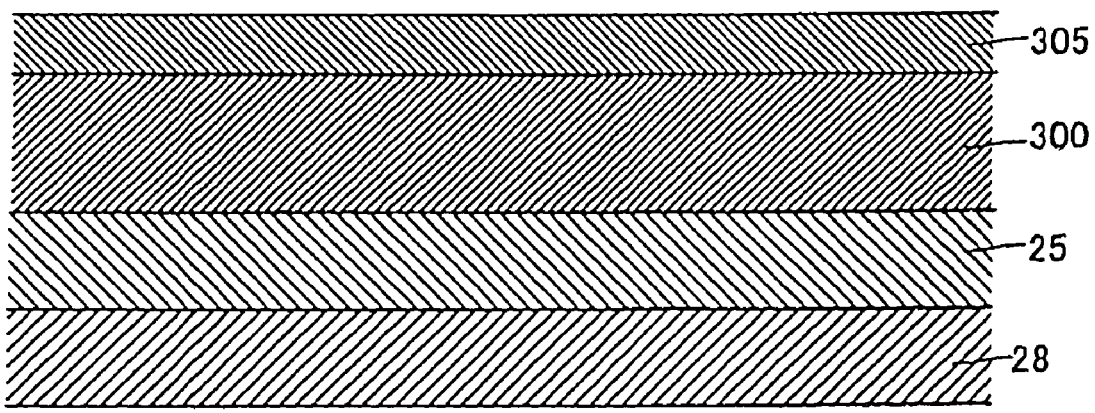
FIG. 16 is a cross sectional view illustrating the step after the step illustrated in FIG. 15.

In the fabrication of the MR element illustrated in FIG. 5, first of all, as illustrated in FIG. 15, on the first shielding layer 28 are successively formed the electrode layer 25 and the MR layer 300. Then, as illustrated in FIG. 16, on the MR film 300 is formed the first magnetic layer 305. These layers can be formed by means of sputtering.

Figure 17:
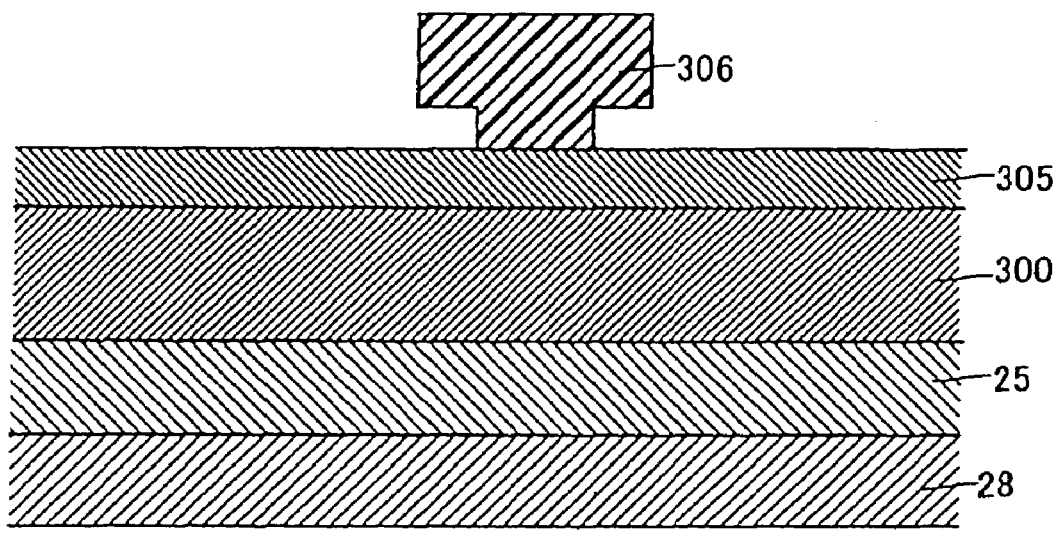
FIG. 17 is a cross sectional view illustrating the step after the step illustrated in FIG. 16.

Then, as illustrated in FIG. 17, on the first gap layer 305 is formed the undercut resist mask 306 by means of conventional technique.

Figure 18:
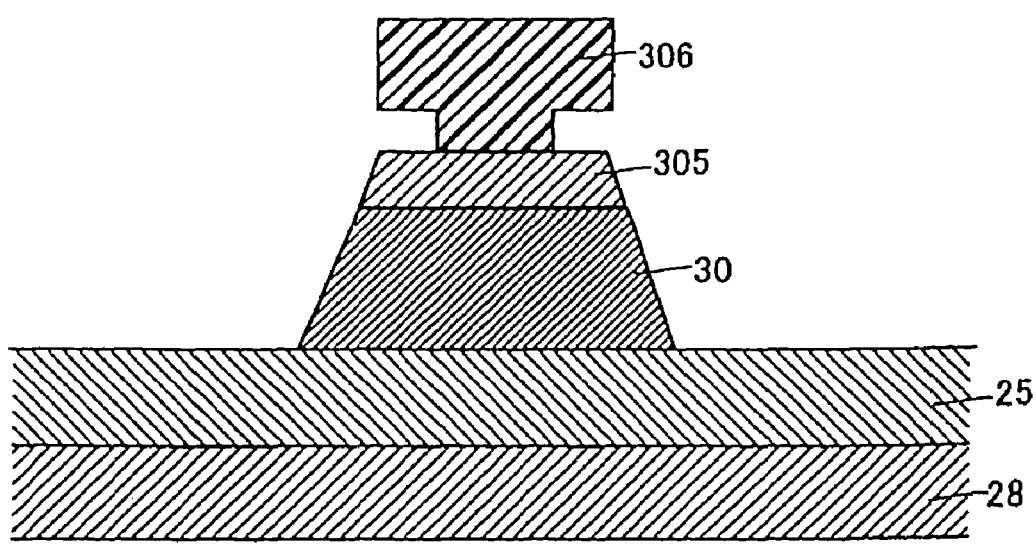
FIG. 18 is a cross sectional view illustrating the step after the step illustrated in FIG. 17.

Then, as illustrated in FIG. 18, the first gap layer 305 and the MR layer 300 is selectively etched by means of dry etching such as ion milling to form the MR film 30 and the first gap layer 305 which are flared downward and have the respective trapezoidal cross sections.

Figure 19:
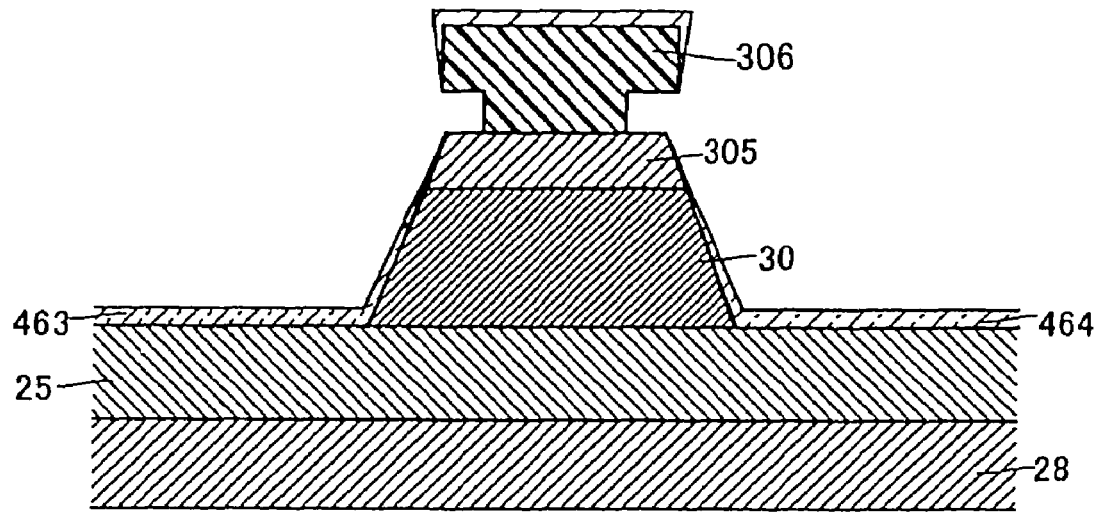
FIG. 19 is a cross sectional view illustrating the step after the step illustrated in FIG. 18.
Figure 20:
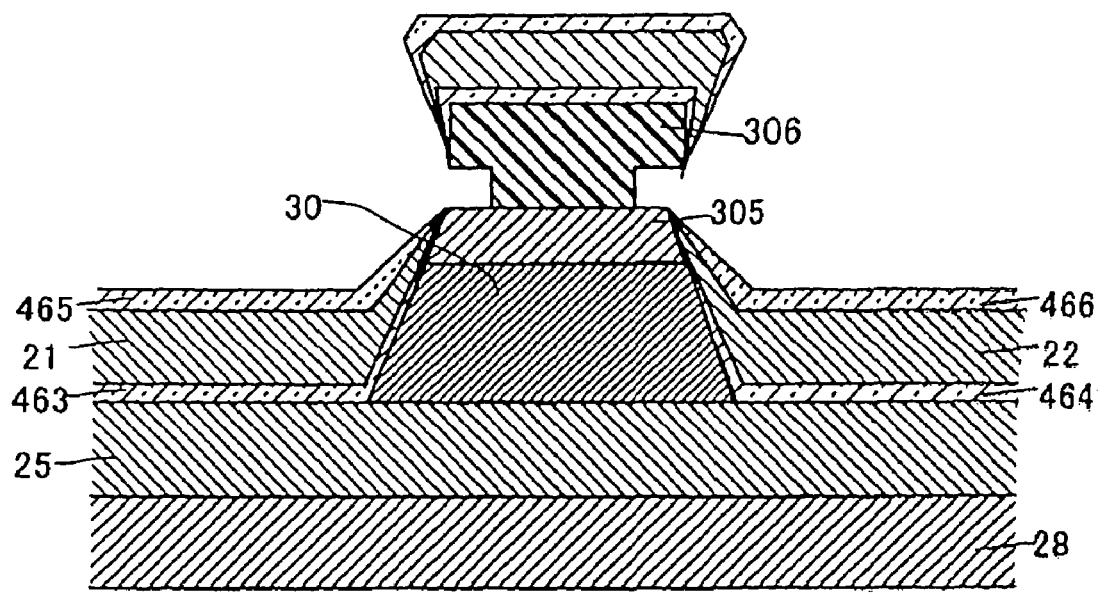
FIG. 20 is a cross sectional view illustrating the step after the step illustrated in FIG. 19.

Then, as illustrated in FIG. 19, a film forming technique such as sputtering is performed over the resist mask 306 to form the insulating layers 463 and 464, and then, as illustrated in FIG. 20, to form the magnetic domain controlling layers 21; 22 and the insulating layers 465; 466.

Figure 21:
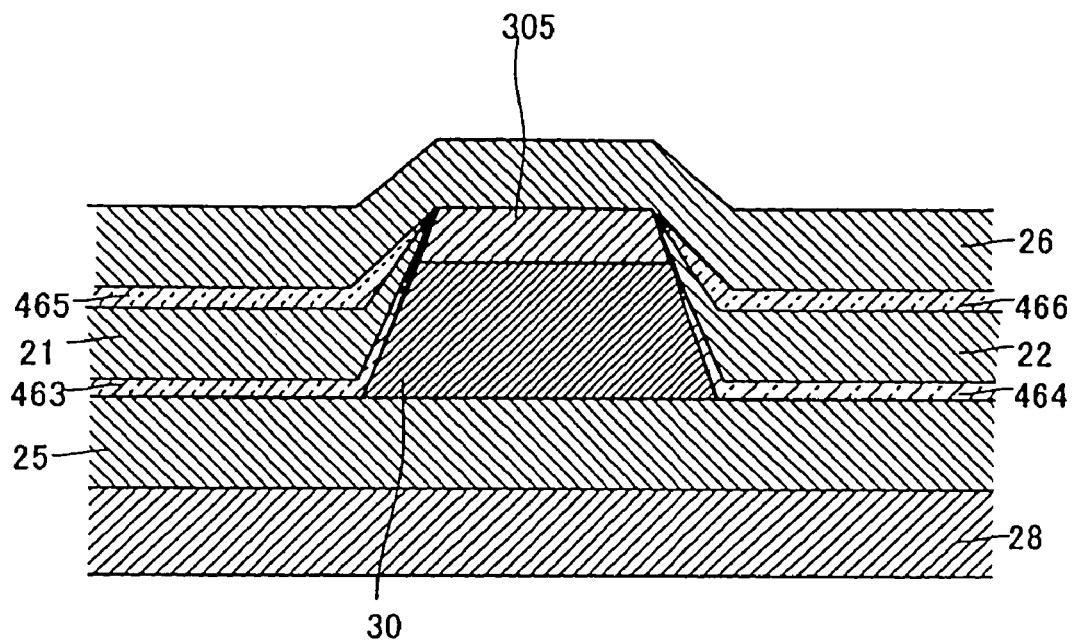
FIG. 21 is a cross sectional view illustrating the step after the step illustrated in FIG. 20.
Figure 22:
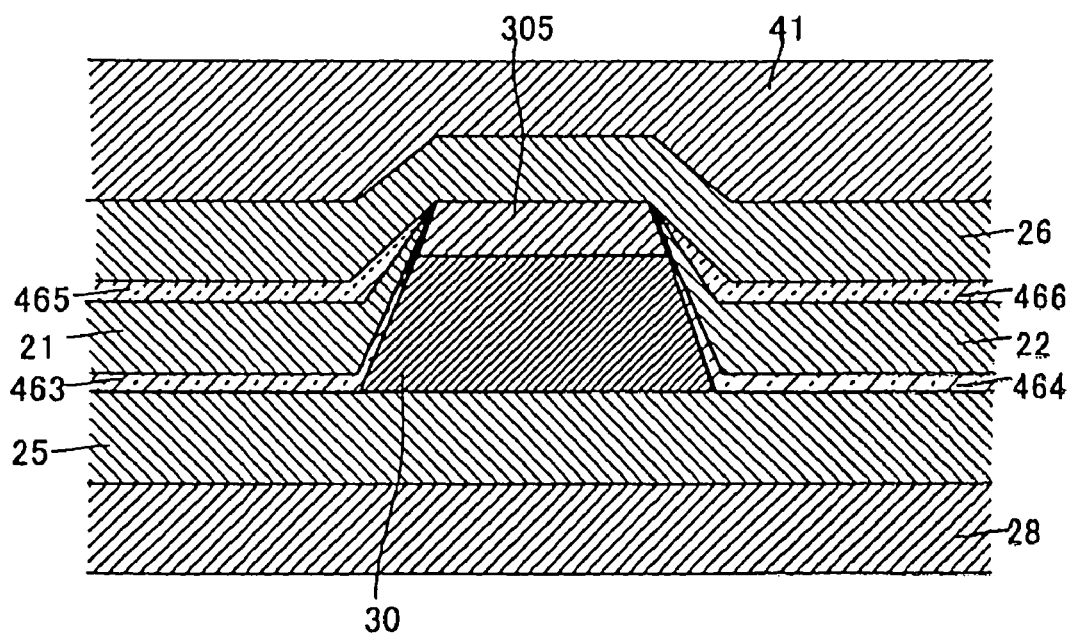
FIG. 22 is a cross sectional view illustrating the step after the step illustrated in FIG. 21.

Then, the resist mask 306 is removed by means of lift off, and then, as illustrated in FIG. 21, a film forming technique such as sputtering is performed to form the electrode layer 26 of Au and the like. Then, as illustrated in FIG. 22, the second shielding layer 41 is formed.

4. Thin Film Magnetic Head

Figure 23:
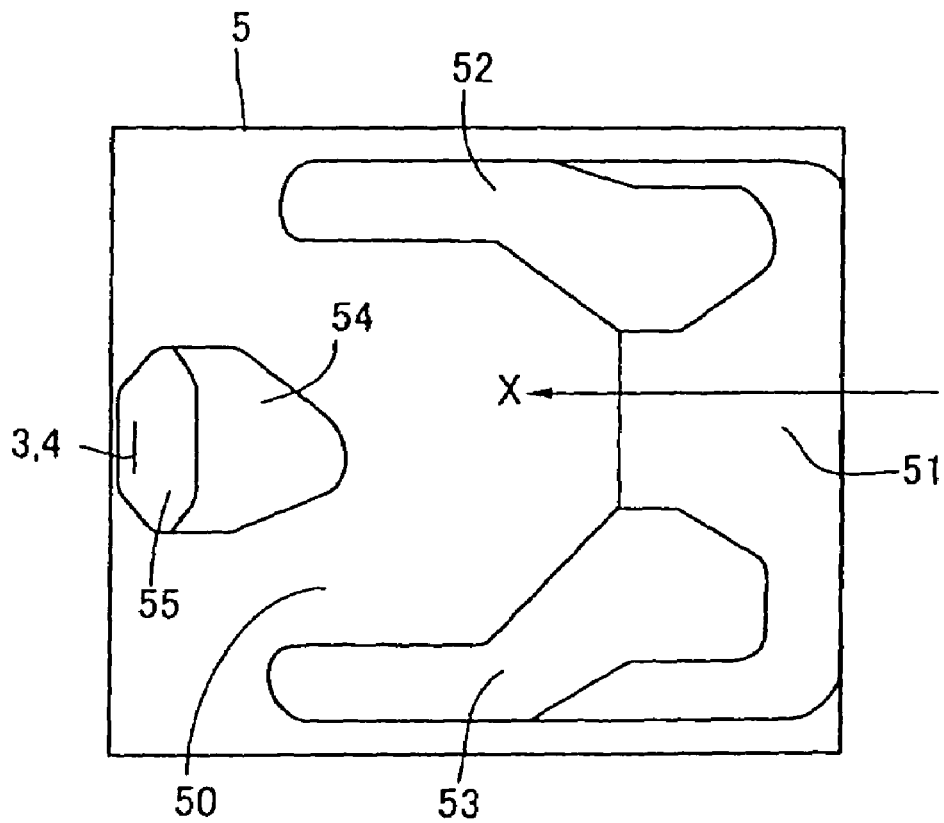
FIG. 23 is a plan view illustrating the side of a thin film magnetic head according to the present invention which is to be opposite to a magnetic disk.
Figure 24:
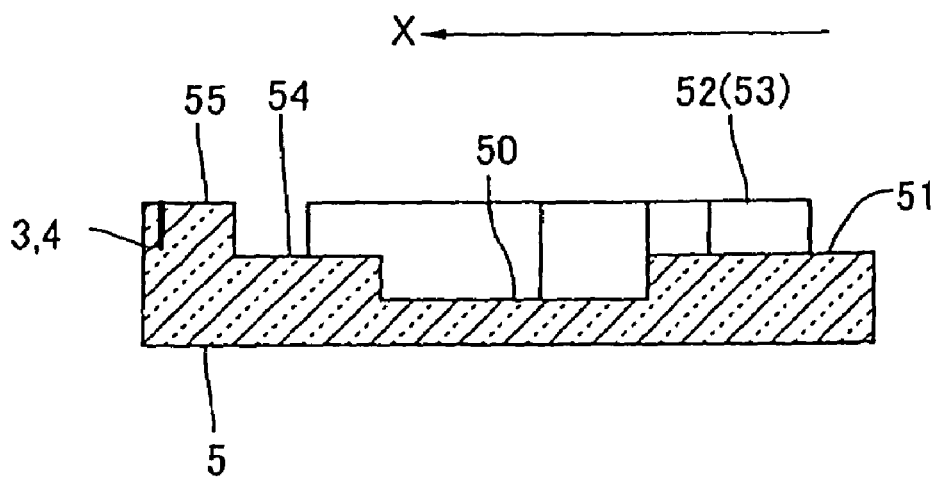
FIG. 24 is a cross sectional front view of the thin film magnetic head illustrated in FIG. 23.
Figure 25:
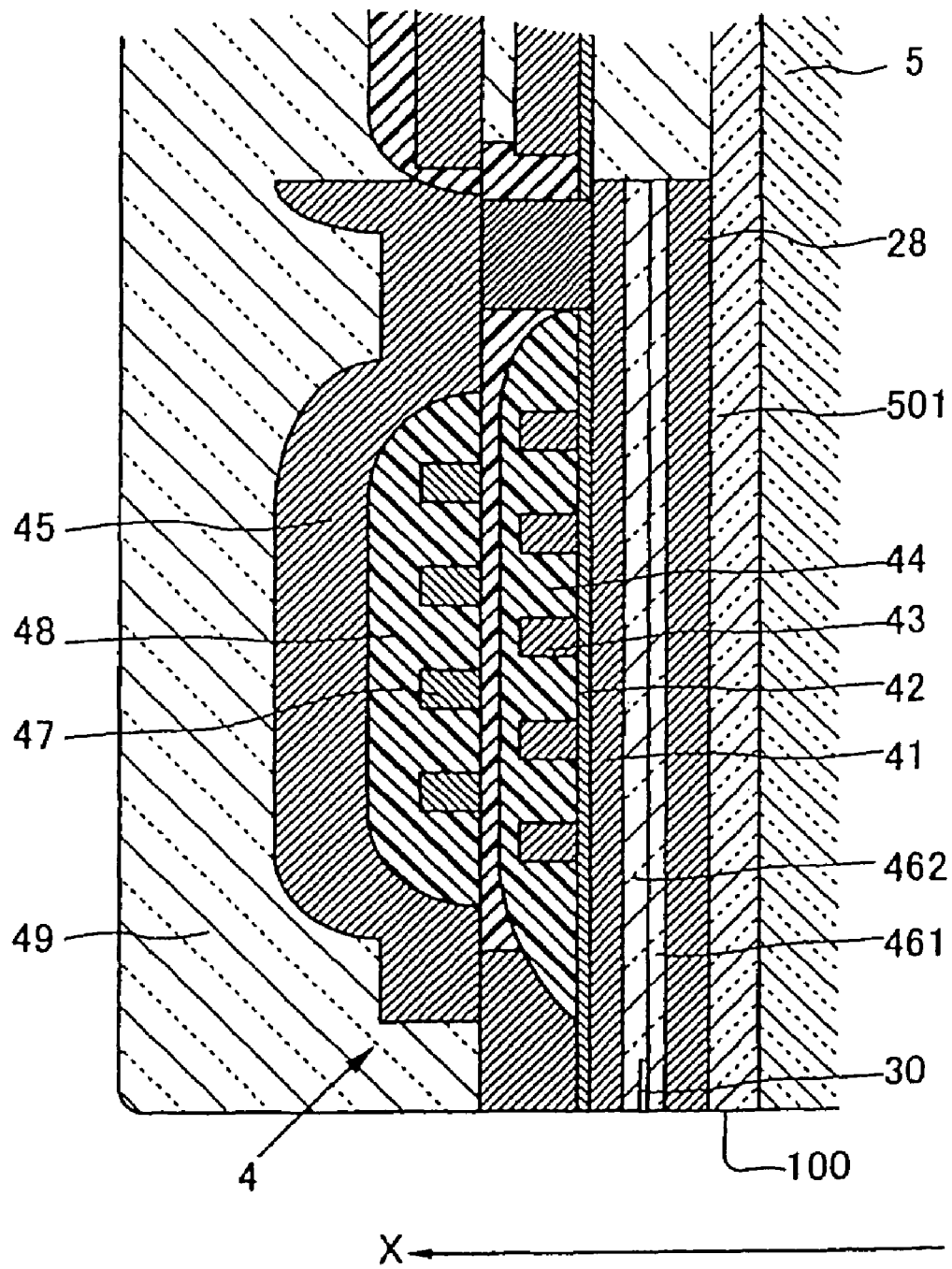
FIG. 25 is an enlarged cross sectional view illustrating a portion of the thin film magnetic head of FIGS. 23 and 24.

FIG. 23 is a perspective view illustrating a thin film magnetic head according to the present invention, and FIG. 24 is a front view illustrating the thin film magnetic head of FIG. 23, and FIG. 25 is an enlarged cross sectional view illustrating a portion of the thin film magnetic head of FIGS. 23 and 24. In these figures, some components are overdrawn or omitted for simplification.

The illustrated thin film magnetic includes a slider base 5, and electromagnetic conversion elements 3 and 4. The slider base 5 is made of ceramic material such as AlTiC ($Al_2O_3$—TiC), and may have various geometrical shape for improving its floating characteristic. As the typical geometrical shape, in this embodiment, the slider base 5 has a first step 51, a second step 52, a third step 53, a fourth step 54 and a fifth step 55 on the base surface 50. The base surface 50 functions as a negative pressure generating region for the air flow designated by the arrow "X". The second step 52 and the third step 53 function as stepwise air bearings rising from the first step 51. The surfaces of the second step 52 and the third step 53 constitute an air bearing surface (hereinafter, called as an "ABS") 100.

The fourth step 54 is risen stepwisely from the base surface 50, and the fifth step 55 is risen stepwisely from the fourth step 54. The electro-magnetic conversion elements 3 and 4 are disposed on the fifth step 55.

Referring to FIG. 25, on the edge of the slider base 5 is formed an insulating film 501 of insulating material such as aluminum oxide ($Al_2O_3$) or $SiO_2$.

The electromagnetic conversion elements 3 and 4 includes an MR element 3 as a reproducing element and a recording element 4, respectively. The MR element 3 is exemplified in FIGS. 1, 5 and 6, and includes an SV film or a TMR film. With the SV film, the MR element 3 is constructed as a CIP type MR element or a CPP type MR element. With the TMR film, the MR element 3 is so constructed that a sense current is inherently flowed perpendicularly through the MR element 3.

The recording element 4 may be made of an inductive type magnetic conversion element of which the magnetic pole edges for writing are exposed to the ABS 100. The recording element 4 is disposed in the vicinity of the MR element 3 as the reproducing element and covered with a protective film 49.

The recording element 4 includes a bottom magnetic layer 41 functioning as a second shielding film, a top magnetic layer 45, a recording gap layer 42, and thin film coils 43 and 47. The bottom magnetic layer 41 is magnetically connected to the top magnetic layer 45. The recording gap layer 42 is disposed between the magnetic pole portions of the bottom magnetic layer 41 and the top magnetic layer 45. The thin film coils 43 and 47 are embedded in insulating layers 44 and 48 formed in the inner gap between the bottom magnetic layer 41 and the top magnetic layer 45.

The MR element 3 includes the MR film 30, the first shielding layer 28, the second gap layers 461; 462, and the second shielding layer 41 made of the bottom magnetic layer 41, and is disposed between the recording element 4 and the slider base 5. The MR element 3 is exemplified in FIGS. 1, 5 and 6. In this case, therefore, the thin film magnetic head can exhibit such functions/effects as mentioned previously with reference to FIGS. 1, 5 and 6.

5. Magnetic Head Device

Figure 26:
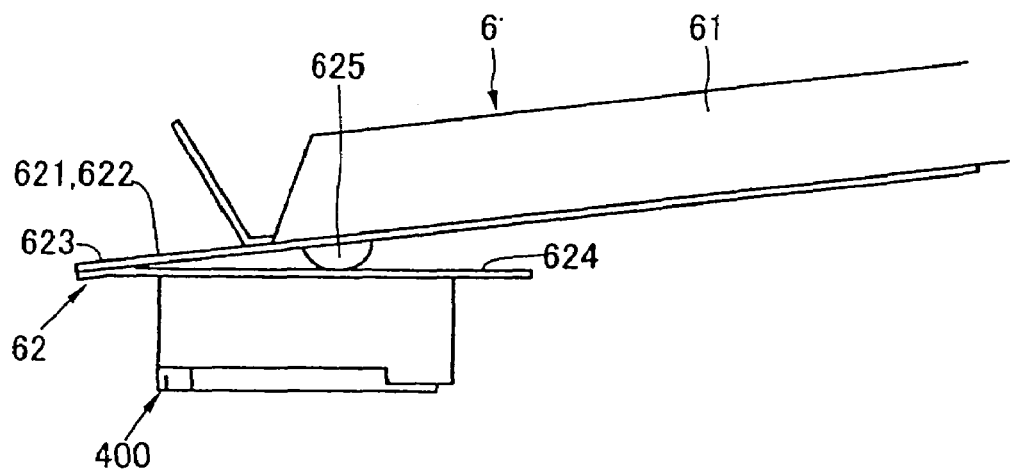
FIG. 26 is a front view illustrating a magnetic head device according to the present invention.
Figure 27:
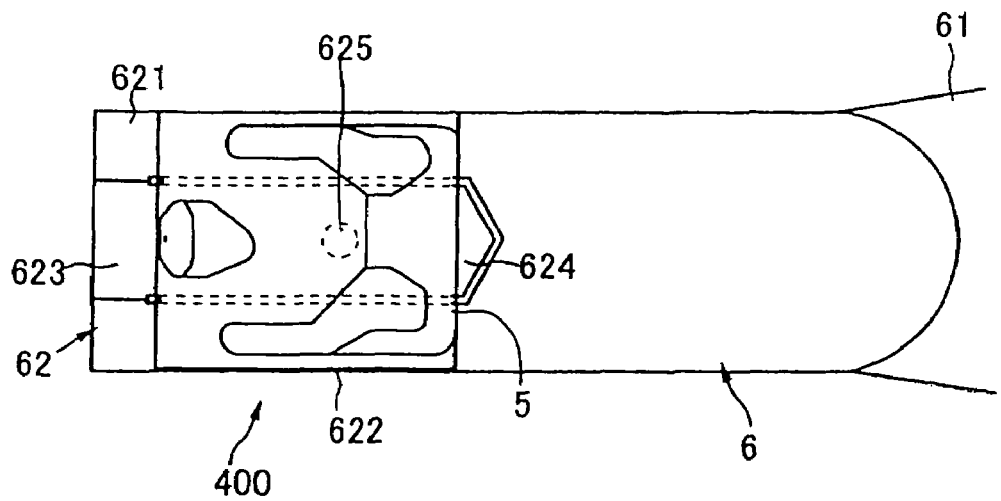
FIG. 27 is a bottom plan view illustrating the magnetic head device of FIG. 26.

FIG. 26 is a front view illustrating a magnetic head device according to the present invention, and FIG. 27 is a bottom plan view of the magnetic head device in FIG. 26. The illustrated magnetic head device includes a thin film magnetic head 400 as illustrated in FIGS. 23-25, and a head supporting device 6. The head supporting device 6 is comprised of a supporter 61 made of a metallic plate and a flexibler 62 made of a metallic plate provided on the free edge of the supporter 61 in the long direction. The thin film magnetic head 400 is attached on the lower surface of the flexibler 62.

The flexibler 62 has two outerframes 621 and 622 substantially parallel to the supporter 61 in the long direction, a lateral frame 623 to join the outer-frames 621 and 622 at the remote portions thereof from the supporter 61, and a tongue shaped member 624, of which the forefront is free, extending substantially parallel to the outerframes 621 and 622 from the almost central portion of the lateral frame 623. The other edge of the tongue shaped member 624 is attached to the free edge of the supporter 61 by means of welding or the like.

On the lower surface of the supporter 61 is provided a hemispheric loading convex portion 625, which conducts a load to the tongue shaped member 624 from the free edge of the supporter 61.

The thin film magnetic head 400 is attached to the lower surface of the tongue shaped member 624 with adhesive or the like, and may be pitch-driven and roll-driven.

The present invention is not limited to the above-mentioned magnetic head device, but applicable for any kind of magnetic head device proposed previously or to be proposed in future. For example, the supporter 61 and the tongue shaped member 624 may be combined with a flexible polymer wiring plate such as TAB tape. Also, a magnetic head device of gimbal structure well known may be employed.

6. Magnetic Recording/Reproducing Device

Figure 28:
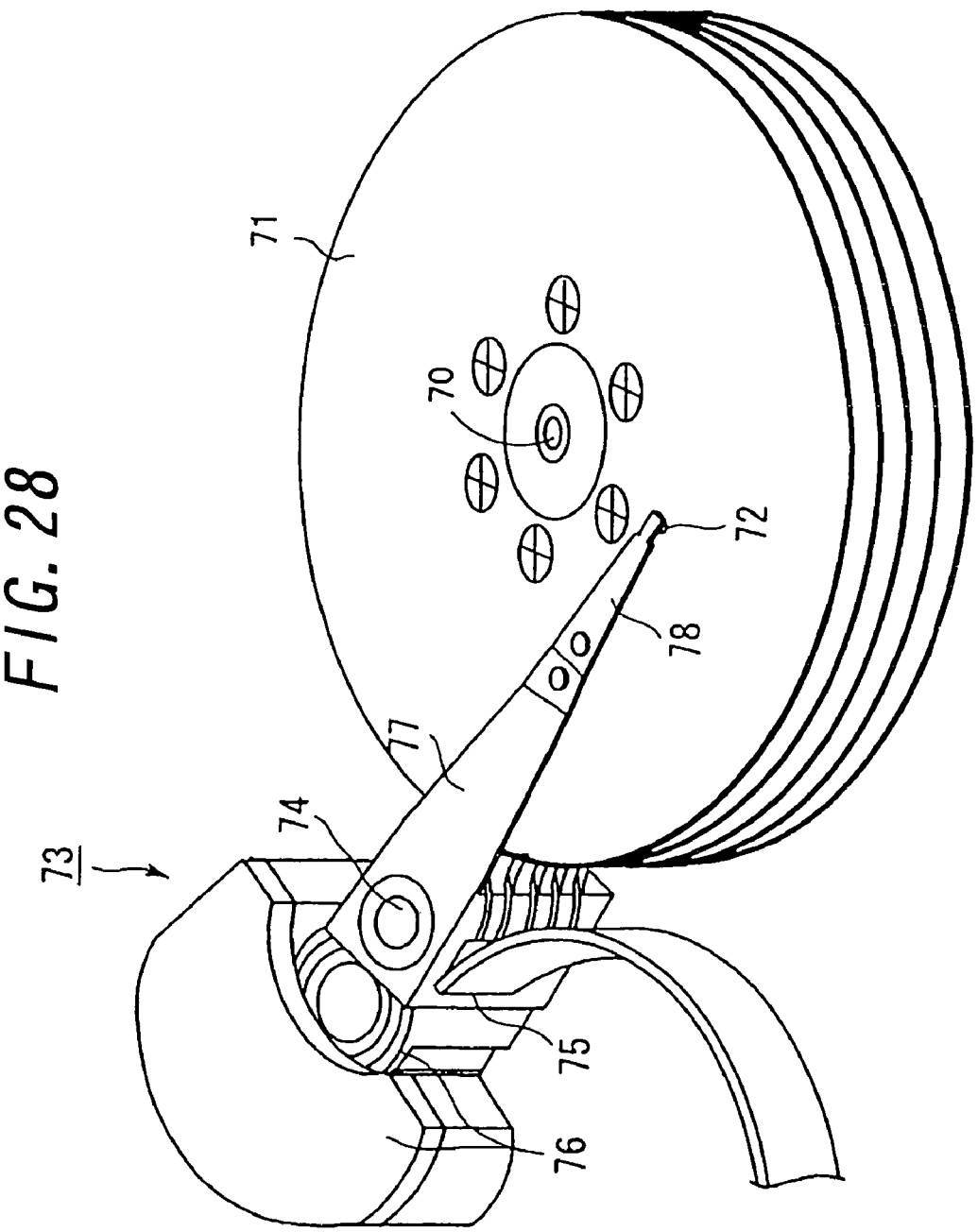
FIG. 28 is a perspective view illustrating a magnetic recording/reproducing device according to the present invention.

FIG. 28 is a perspective view illustrating a magnetic recording/reproducing device according to the present invention. The illustrated magnetic recording/reproducing device includes recording disks 71 provided rotatably around a shaft 70, thin film magnetic heads 72 to record and reproducing information in and out of the corresponding magnetic disks 71, and an assembly carriage device 73 to position the corresponding thin film magnetic heads 72 on predetermined respective tracks of the magnetic disks 71.

The assembly carriage device 73 is mainly composed of a carriage 75 provided rotatably around a shaft 74 and an actuator 76 made of a voice coil motor (VCM) or the like to rotate the carriage 75.

To the carriage 75 are attached the bases of a plurality of driving arms 77 which are stacked in the direction along the shaft 74. To the forefront of each driving arm 77 is attached a head suspension assembly 78 on which the corresponding thin film magnetic head 82 is mounted so as to be faced to the corresponding magnetic disk 71.

The driving arms 77, the head suspension assemblies 78 and the thin film magnetic heads 72 constitute a magnetic head device as described previously with reference to FIGS. 26 and 27. Each thin film magnetic head 72 includes an MR element as illustrated in FIGS. 1, 5 and 6 as a reproducing element, and is constructed as illustrated in FIGS. 23-25. Therefore, the magnetic recording/reproducing device can exhibit such functions/effects as mentioned previously with reference to FIGS. 1, 5, 6 and 23-25.

Although the present invention was described in detail with reference to the above examples, this invention is not limited to the above disclosure and every kind of variation and modification may be made without departing from the scope of the present invention.

As mentioned above, according to the present invention can be provided a MR element, a thin film magnetic head, a magnetic head device and a magnetic recording/reproducing device which can reduce a reading bleeding at a track edge and realize a high output stability.

What is claimed is:

1. A magnetoresistive effective element comprising a first shielding layer, a second shielding layer, a magnetoresistive effective film, a first gap film, a pair of second gap layers, a pair of magnetic domain controlling layers, and a bottom electrode layer, said first shielding layer and said second shielding layer being separated by a given distance, said magnetoresistive effective film being disposed in between said first shielding layer and said second shielding layer, said first gap film being made of electrical conductive material, and formed on said magnetoresistive effective film commensurate with a surface configuration of said magnetoresistive effective film, said magnetic domain controlling layers surrounding and extending along both sides of said magnetoresistive effective film, respectively, said bottom electrode layer being electrically connected to said magnetoresistive effective film on a side away from said first gap film, the bottom electrode layer constituting one of the pair of second gap layers, said second shielding layer functioning as a top electrode layer electrically connected to said first gap film, and the second shielding layer constituting the other of the pair of second gap layers, wherein a total thickness of said magnetoresistive effective film and said first gap film is larger than a thickness of the magnetic domain controlling layers to suppress the effects of a defective side lobe, and surfaces of said second shielding layer corresponding to said magnetic domain controlling layers extending along both sides of said magnetoresistive effective film are formed closer to said bottom electrode layer than a surface of said magnetoresistive effective film on which said first gap film is formed.

2. The magnetoresistive effective element as defined in claim 1, wherein said magnetoresistive effective film is made of a spin valve film or a ferromagnetic tunnel junction film.

3. The magnetoresistive effective element as defined in claim 1, wherein said first gap film is made of metal.

4. The magnetoresistive effective element as defined in claim 1, wherein both sides of said second shielding layer are depressed at both sides of the magnetoresistive effective film in a front view, respectively.

* * * * *